United States Patent
Ahn et al.

(10) Patent No.: US 9,355,720 B2
(45) Date of Patent: May 31, 2016

(54) WRITE DRIVER, VARIABLE RESISTANCE MEMORY APPARATUS INCLUDING THE SAME, AND OPERATION METHOD

(71) Applicant: SK hynix Inc., Icheon-si Gyeonggi-do (KR)

(72) Inventors: Chang Yong Ahn, Icheon-si (KR); Yoon Jae Shin, Icheon-si (KR); In Soo Lee, Icheon-si (KR); Jun Ho Cheon, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/515,774

(22) Filed: Oct. 16, 2014

(65) Prior Publication Data
US 2016/0042788 A1 Feb. 11, 2016

(30) Foreign Application Priority Data
Aug. 5, 2014 (KR) .................. 10-2014-0100444

(51) Int. Cl.
*G11C 13/00* (2006.01)
(52) U.S. Cl.
CPC ........ *G11C 13/0069* (2013.01); *G11C 13/0061* (2013.01); *G11C 13/0004* (2013.01); *G11C 13/0064* (2013.01); *G11C 2013/0076* (2013.01); *G11C 2013/0078* (2013.01); *G11C 2013/0092* (2013.01)

(58) Field of Classification Search
CPC ........... G11C 13/0061; G11C 13/0069; G11C 13/0002
USPC ....................................................... 365/148
See application file for complete search history.

(56) References Cited

U.S. PATENT DOCUMENTS

| 6,975,473 | B2* | 12/2005 | Ngo | G11B 5/012 360/46 |
|---|---|---|---|---|
| 7,092,312 | B2* | 8/2006 | Choi | G11C 7/1045 365/189.14 |
| 7,365,928 | B2* | 4/2008 | Venca | G11B 5/02 360/46 |
| 7,411,756 | B2* | 8/2008 | Wilson | G11B 5/465 360/46 |
| 7,436,693 | B2* | 10/2008 | Kang | G11C 13/0004 365/148 |
| 8,369,137 | B2* | 2/2013 | Yoon | G11C 29/08 365/148 |
| 2005/0117388 | A1* | 6/2005 | Cho | G11C 13/0004 365/163 |
| 2008/0025080 | A1* | 1/2008 | Chan | G11C 11/56 365/163 |
| 2012/0194224 | A1* | 8/2012 | Moon | H03K 5/1515 327/99 |
| 2013/0051120 | A1* | 2/2013 | Oh | G11C 13/0004 365/148 |
| 2013/0163321 | A1* | 6/2013 | Lam | G11C 11/5628 365/163 |

FOREIGN PATENT DOCUMENTS

KR 100809339 B1 2/2008
KR 1020130021706 A 3/2013

* cited by examiner

*Primary Examiner* — Huan Hoang
*Assistant Examiner* — Roberto Mancera
(74) *Attorney, Agent, or Firm* — William Park & Associates Ltd.

(57) ABSTRACT

A write driver is configured to determine a magnitude and an application time of a pre-emphasis current pulse in response to control codes generated according to parasitic components on a path from a write driver to a program target cell and a resistance value of the program target cell, and supply a preset program current to a memory circuit block by adding a pre-emphasis current to the preset program current in a program mode.

14 Claims, 10 Drawing Sheets

WRITE DRIVER, VARIABLE RESISTANCE MEMORY APPARATUS INCLUDING THE SAME, AND OPERATION METHOD

CROSS-REFERENCES TO RELATED APPLICATION

The present application claims priority under 35 U.S.C. §119(a) to Korean application number 10-2014-0100444, filed on Aug. 8, 2014, in the Korean Intellectual Property Office, which is incorporated herein by reference in its entirety.

BACKGROUND

1. Technical Field

Various embodiments generally relate to a semiconductor integrated circuit, and more particularly, to a write driver, a variable resistance memory apparatus including the same, and an operation method.

2. Related Art

Among nonvolatile memories, variable resistance memory elements such as the phase change RAM and the resistive RAM define information storage states according to the resistant state of the data storage material. In the variable resistance memory elements, program current is applied in a program operation in such a manner that the data storage material may have a desired resistant state.

A decrease in a rising slope of the program current pulse means that a required amount of current is not transferred to a target cell and target data is not written. Therefore, in order to write the target data, it is necessary to repeat program and verify processes several times.

Under this situation, a method of compensating for a program current pulse in consideration of a time constant determined according to a path from a write driver to a cell may be adopted. However, if only a time constant determined according to a path from a write driver to a cell is considered, an overshoot phenomenon is likely to occur according to the resistant state of the cell before program.

SUMMARY

In an embodiment, a write driver may be configured to determine a magnitude and an application time of a pre-emphasis current pulse in response to control codes generated according to parasitic components existing on a path from a write driver to a program target cell and a resistance value of the program target cell. In addition, the write driver may be configured to supply a preset program current to a memory circuit block by adding a pre-emphasis current to the preset program current in a program mode.

In an embodiment, a variable resistance memory apparatus may include a memory circuit block including a plurality of variable resistance memory cells. The variable resistance memory apparatus may also include a controller configured to generate control codes according to parasitic components on a path from a write driver to a program target cell and a resistance value of the program target cell in a write mode. In addition, the variable resistance memory apparatus may include a write driver configured to determine a magnitude and an application time of a pre-emphasis current pulse in response to the control codes, and supply a preset program current to the memory circuit block by adding a pre-emphasis current to the preset program current.

In an embodiment, a program method of a variable resistance memory apparatus may include reading a resistance value of a program target cell in response to a write command. The program method may also include generating control codes according to parasitic components on a path from a write driver to the program target cell and the resistance value of the program target cell. Further, the program method may include supplying a pre-emphasis current pulse with a magnitude and an application time determined according to the control codes to the program target cell by adding the pre-emphasis current pulse to program current.

DETAILED DESCRIPTION

Hereinafter, a write driver, a variable resistance memory apparatus including the same, and an operation method will be described below with reference to the accompanying drawings through various examples.

Figure 1:
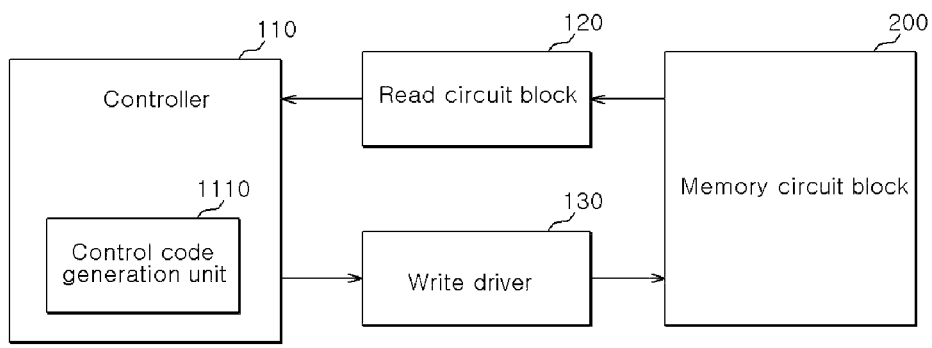
FIG. 1 is a configuration diagram illustrating a representation of an example of a variable resistance memory apparatus in accordance with an embodiment.

Referring to FIG. 1, a configuration diagram illustrating a representation of an example of a variable resistance memory apparatus in accordance with an embodiment is shown.

A variable resistance memory apparatus 10 may include a memory circuit block 200, a controller 110, a read circuit block 120, and a write driver 130.

The memory circuit block 200 may have a plurality of variable resistance memory cells electrically coupled between word lines and bit lines, and a row selection unit and a column selection unit to access the respective memory cells.

The controller 110 may receive a command, an address and data from an exterior. In addition, the controller 110 may program the data in the memory circuit block 200 by controlling the write driver 130. Further, the controller 110 may receive a command and an address from the exterior, read data from the memory circuit block 200 by controlling the read circuit block 120, and output read data to the exterior.

More specifically, in a program operation, the controller 110 reads in advance the resistant state of a target cell by controlling the read circuit block 120. Further, a control code generation unit 1110 provided in the controller 110 generates control codes to control a pre-emphasis current pulse, based on the parasitic components existing on the path from the write driver 130 to the target cell and the resistant state of the target cell which is read in advance.

In an embodiment, the control code generation unit 1110 may determine the pulse magnitude and the pulse application time (the pulse width) of pre-emphasis current, based on the parasitic components existing on the path to the target cell and the resistant state of the target cell.

In an embodiment, the control code generation unit 1110 may preset the magnitude of a pre-emphasis current pulse. In addition, the control code generation unit 1110 may generate the control codes such that the application time of the pre-emphasis current pulse may be changed according to the parasitic components existing on the path from the write driver 130 to the target cell and the resistant state of the target cell.

Further, the control code generation unit 1110 may set the magnitude of the pre-emphasis current pulse in such a way as to become different according to the distance from the write driver 130 to the target cell. Further, the control code generation unit 1110 may generate the control codes such that the application time of the pre-emphasis current pulse may be changed based thereon.

In an embodiment, the control code generation unit 1110 may calculate in advance the application time of the pre-emphasis current pulse according to a preset standard. The control code generation unit 1110 may also generate the control codes such that the magnitude of the pre-emphasis current pulse may be changed according to the parasitic components existing on the path from the write driver 130 to the target cell and the resistant state of the target cell.

The write driver 130 may perform the program operation by supplying the pre-emphasis current determined according to the control codes to the target cell along with preset program current.

Figure 2:
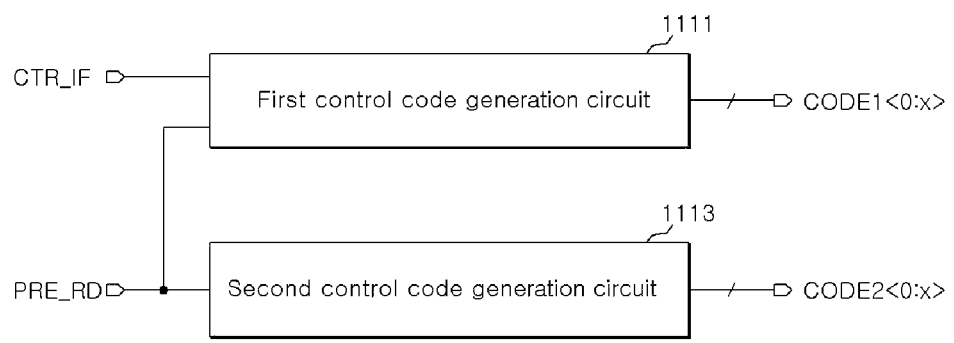
FIG. 2 is a configuration diagram illustrating a representation of an example of the control code generation unit shown in FIG. 1.

Referring to FIG. 2, a configuration diagram illustrating a representation of an example of the control code generation unit 1110 shown in FIG. 1 is illustrated.

The control code generation unit 1110 may be configured to include a first control code generation circuit 1111 and a second control code generation circuit 1113.

The first control code generation circuit 1111 generates first control codes CODE1<0:x> based on control information CTR_IF and a resistant state PRE_RD of the target cell. The control information CTR_IF may include preset program current $I_{PGM}$. The control information CTR_IF may also include the parasitic components existing on the path from the write driver 130 to the target cell, for example, parasitic resistance $R_P$ and parasitic capacitance $C_P$. In an embodiment, the first control codes CODE1<0:x> may be configured to determine the magnitude, or, the level, of the pre-emphasis current pulse.

The second control code generation circuit 1113 generates second control codes CODE2<0:x> based on the resistant state PRE_RD of the target cell. In an embodiment, the second control codes CODE2<0:x> may be configured to determine the application time of the pre-emphasis current pulse.

An example of the principle of generating the first control codes CODE1<0:x> and the second control codes CODE2<0:x> in the control code generation unit 1110 will be described below.

In general, a voltage V, current I and resistance R have the relationship expressed in the following Equation 1.

$$V = IR \quad \text{[Equation 1]}$$

It is known that, when considering a time constant τ by the parasitic components existing on the path from the write driver 130 to the target cell, that is, the parasitic resistance $R_P$ and the parasitic capacitance $C_P$, a charge voltage for a parasitic capacitor may be expressed as in Equation 2.

$$V_O = V_{IN}\left(1 - e^{\frac{-t}{\tau}}\right) \quad \text{[Equation 2]}$$

Here, $V_O$ means the charge voltage, $V_{IN}$ means an input voltage, and t is a charge time.

When assuming a situation in which a desired voltage is applied to the target cell by supplying current which results from adding pre-emphasis current $I_{PRE}$ to the preset program current $I_{PGM}$, Equation 3 may be derived from Equation 1 and Equation 2.

$$I_{PGM} \times R_{PATH} = \left(1 - e^{-\frac{t}{\tau}}\right) \times \{(I_{PGM} + I_{PRE}) \times R_{PATH}\} \quad \text{[Equation 3]}$$

In Equation 3, $R_{PATH}$ may be expressed as $R_{PATH} = R_P \pm R_{cell}$ that is the sum of the parasitic resistance $R_P$ existing on the path to the target cell and resistance $R_{cell}$ of the target cell. The program current $I_{PGM}$ is a preset value, and the time constant τ is determined as $\tau = (R_P \pm R_{cell}) \times C_P = R_{PATH} C_P$ in consideration of the parasitic resistance $R_P$ and the parasitic capacitance $C_P$ existing on the path from the write driver 130 to the target cell and the resistance $R_{cell}$ of the target cell itself.

By rewriting Equation 3 with respect to the pre-emphasis current $I_{PRE}$, Equation 4 is obtained.

$$I_{PRE} = \frac{\left(e^{-\frac{t}{\tau}}\right)}{\left(1 - e^{-\frac{t}{\tau}}\right)} \times I_{PGM} \quad \text{[Equation 4]}$$

As a result, it may be seen that the magnitude of the pre-emphasis current $I_{PRE}$ is related with the application time of the pre-emphasis current $I_{PRE}$.

Based on this fact, in the embodiment, two pre-emphasis schemes are proposed. One is a time variable program scheme and the other is a current variable program scheme.

<Time Variable Program Scheme>

First, the time variable program scheme will be described below.

In an embodiment, the pre-emphasis current $I_{PRE}=g*I_{PGM}$ which results from increasing the program current $I_{PGM}$ by the same multiple g for all target cells is supplied. Further, the supply times t of the pre-emphasis current $I_{PRE}$ are changed in consideration of the time constants $\tau=(R_P+R_{cell}) \times C_P=R_{PATH}C_P$. It is the matter of course that the parasitic resistance $R_P$ and the parasitic capacitance $C_P$ may have different values according to the distances from the write driver 130 to the target cells. In addition, the time constants T are determined by the parasitic components existing on the paths and the pre-read operation.

Therefore, the pre-emphasis current $I_{PRE}$ of the constant magnitude $g*I_{PGM}$ may be supplied for the times t that are calculated from Equation 4 according to the positions and the resistant states of the target cells.

In an embodiment of the time variable program scheme, the pre-emphasis current $I_{PRE}$ which results from increasing the program current $I_{PGM}$ by multiples g1 to gm differently determined according to the distances from the write deriver 130 to respective target cells may be supplied. Even in this case, the supply time t of the pre-emphasis current $I_{PRE}$ may be changed in consideration of the time constants determined according to the parasitic components existing on paths to the target cells and the resistant states of the target cells. In other words, the program current $I_{PGM}$ is increased by the same multiple g1 for all target cells which are at a first distance from the write driver 130. Moreover, the program current $I_{PGM}$ is increased by the same multiple g2 different from the first multiple g1 for all target cells which are at a second distance from the write driver 130, and so forth. In this way, the magnitudes of the pre-emphasis current $I_{PRE}$ may be set in such that the program current $I_{PGM}$ is increased by the same multiple for target cells of the same position and is increased by another the same multiple for target cells of another the same position. Furthermore, the application times t of the pre-emphasis current $I_{PRE}$ may be calculated based on the multiples g1 to gm set according to the positions of the target cells and Equation 4.

Describing the time variable program scheme in detail, the pre-read operation is performed in advance for all target cells to be programmed. Further, the time constants T are calculated, based on the parasitic components $R_P$ and $C_P$ to the target cells.

Then, the value or values that results or result from increasing the program current $I_{PGM}$ by the predetermined multiple g or the predetermined multiples g1 to gm are set as the level or levels of the pre-emphasis current $I_{PRE}$, and based on the level or levels of the pre-emphasis current $I_{PRE}$, the supply times t of the pre-emphasis current $I_{PRE}$ are calculated. Thereafter, at the same time the program current $I_{PGM}$ is supplied, the pre-emphasis current $I_{PRE}$ is supplied to the target cells according to the level or levels of the pre-emphasis current $I_{PRE}$ and the calculated pre-emphasis current supply times t.

<Current Variable Program Scheme>

In an embodiment, a multiple H to increase the program current $I_{PGM}$ for a specific cell, for example, a cell farthest away from the write driver 130, is determined. Then, the supply time t of pre-emphasis current $I_{PRE,far}$ is calculated, based on the determined multiple H and the time constant $\tau=(R_P+R_{cell,far})\times C_F=R_{PATH}C_P$ obtained from the corresponding cell, that is, the farthest cell. Accordingly, the pre-emphasis current $I_{PRE,far}$ which results from increasing the program current $I_{PGM}$ H times may be supplied to the cell farthest away from the write driver 130, for the calculated pre-emphasis current supply time t.

With respect to cells except the farthest cell, multiples to increase the program current $I_{PGM}$ are determined for the respective cells, based on the time constants of the respective cells, the pre-emphasis current supply time t obtained through the above process, and Equation 4. Then, the pre-emphasis current $I_{PRE}$ increased by the multiples determined for the respective cells is supplied for the pre-emphasis current supply time t.

In an embodiment of the current variable program scheme, an initial increase multiple H may be subdivided according to the resistance $R_{cell}$ of a cell itself and target resistance $R_{target}$. For example, a cell of which resistance $R_{cell}$ is discriminated, as a result of pre-read, to be higher than the target resistance $R_{target}$ may be determined to require a relatively large amount of pre-emphasis current, and a cell of which resistance $R_{cell}$ is discriminated, as a result of pre-read, to be lower than the target resistance $R_{target}$ may be determined to require a relatively small amount of pre-emphasis current.

Therefore, in the case of the cell of which resistance $R_{cell}$ is discriminated, as a result of pre-read, to be higher than the target resistance $R_{target}$, an initial increase multiple may be set as H1 as a value larger than H. Further, in the case of the cell of which resistance $R_{cell}$ is discriminated, as a result of pre-read, to be lower than the target resistance $R_{target}$, an initial increase multiple may be set as H2 as a value smaller than H.

Describing the current variable program scheme in detail, the resistance $R_{cell}$ of respective cells is first checked for all memory cells to be programmed, through a pre-read operation. In addition, time constants $\tau$ are calculated therefrom.

Thereafter, the pre-emphasis current supply time t is calculated. To this end, it is assumed that the pre-emphasis current $I_{PRE,far}$ which results from increasing the program current $I_{PGM}$ by a preset multiple (H, H1 or H2) is supplied to a memory cell which is disposed at a specified position. The specified position may be for example, farthest away from the write driver 130. The pre-emphasis current supply time t is calculated for the memory cell farthest away from the write driver 130 by using Equation 4.

For the remaining cells, multiples to increase the program current $I_{PGM}$ are calculated in consideration of the pre-emphasis current supply time t and the time constants T of the respective cells or in additional consideration of the target resistance $R_{target}$ for the respective cells. Then, the pre-emphasis current $I_{PRE}$ increased by the calculated multiples is supplied for the pre-emphasis current supply time t calculated in advance.

As a result, the first control code generation circuit 1111 may generate the first control codes CODE1<0:x> such that a pre-emphasis current pulse may be supplied with a magnitude determined by any one of the time variable program scheme and the current variable program scheme. Moreover, the second control code generation circuit 1113 may generate the second control codes CODE2<0:x> such that pre-emphasis current may be supplied for a time determined by any one of the time variable program scheme and the current variable program scheme.

Figure 3:
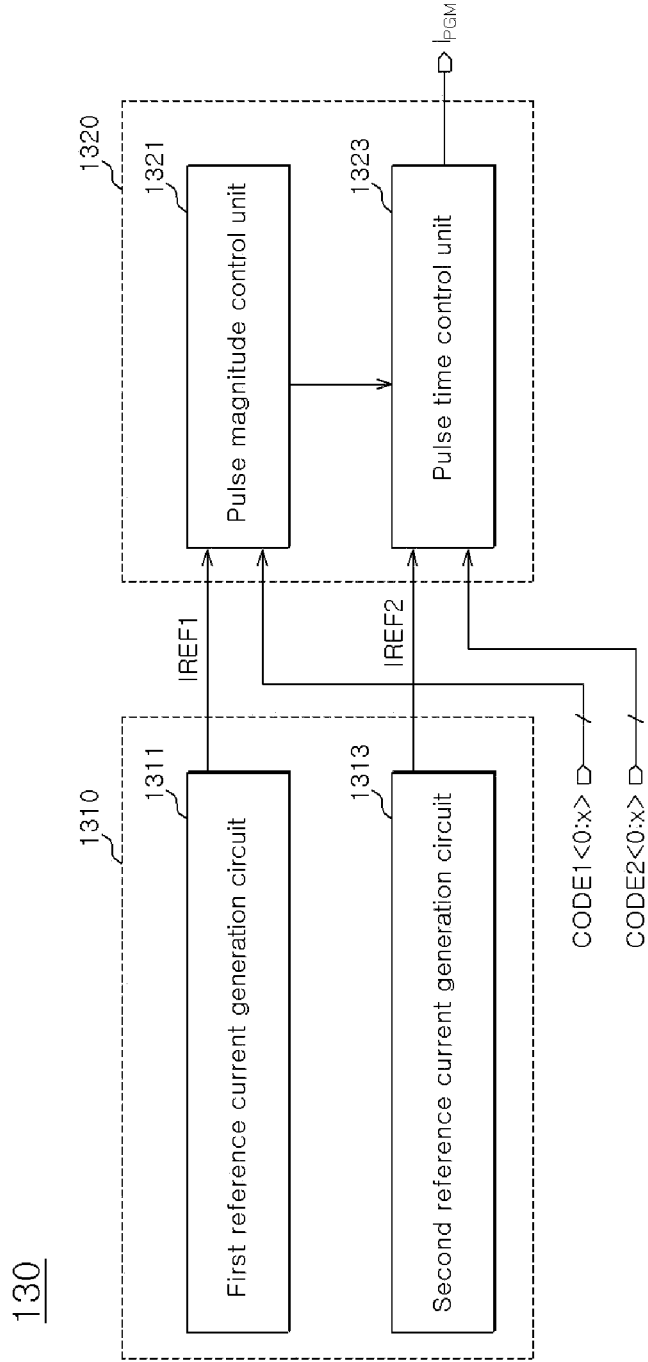
FIG. 3 is a configuration diagram illustrating a representation of an example of a write driver in accordance with an embodiment.

Referring to FIG. 3, a configuration diagram illustrating a representation of an example of the write driver 130 in accordance with an embodiment is shown.

The write driver 130 may be configured to include a reference current generation circuit 1310 and a pulse generation circuit 1320.

The reference current generation circuit 1310 generates reference current of preset magnitudes. In an embodiment, the reference current generation circuit 1310 may include a first reference current generation circuit 1311 which generates first reference current IREF1 and a second reference current generation circuit 1313 which generates second reference current IREF2.

The pulse generation circuit 1320 mirrors the reference current IREF1 and IREF2 generated by the reference current generation circuit 1310 in response to the control codes CODE1<0:x> and CODE2<0:x>. Accordingly, the pulse generation circuit 1320 generates the pre-emphasis current $I_{PRE}$ which has the magnitude and the width determined according to the parasitic components existing on the path from the write driver 130 to a cell and the resistance of the cell itself. The pulse generation circuit 1320 generates the program current $I_{PGM}$ including the pre-emphasis current $I_{PRE}$, and supplies the program current $I_{PGM}$ to the memory circuit block 200. In an embodiment, the pulse generation circuit 1320 may include a pulse magnitude control unit 1321 which controls the magnitude of the pre-emphasis current $I_{PRE}$ in response to the first reference current IREF1 and the first control codes CODE1<0:x>. Further, the pulse generation circuit 1320 may include a pulse time control unit 1323 which controls the supply time of the pre-emphasis current $I_{PRE}$ in response to the second reference current IREF2 and the second control codes CODE2<0:x>.

The pre-emphasis current $I_{PRE}$, which has the magnitude and the width determined by the pulse magnitude control unit 1321 and the pulse time control unit 1323, is added with the mirroring results of the reference current IREF1 and IREF2. The pre-emphasis current $I_{PRE}$ is also generated as the program current $I_{PGM}$, and is supplied to a target cell electrically coupled with the corresponding write driver 130.

Figure 4:
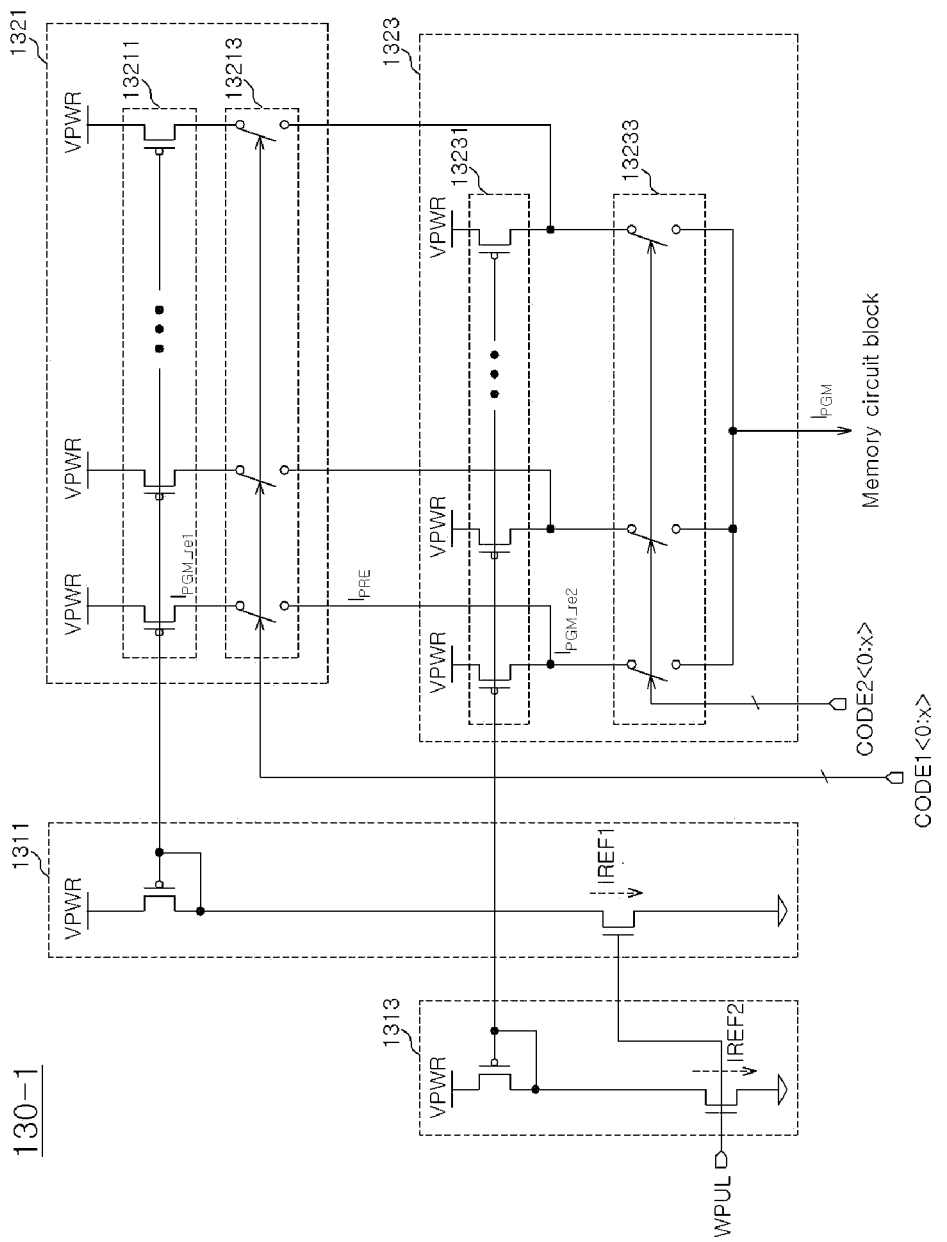
FIG. 4 is a circuit diagram illustrating a representation of an example of a write driver in accordance with an embodiment.

Referring to FIG. 4, a circuit diagram illustrating a representation of an example of a write driver 130-1 in accordance with an embodiment is shown.

A first reference current generation unit 1311 generates first reference current IREF1 determined by a write voltage VPWR in response to a write pulse enable signal WPUL. Similarly, a second reference current generation unit 1313 generates second reference current IREF2 determined by the write voltage VPWR in response to the write pulse enable signal WPUL.

A pulse magnitude control unit 1321 may include a first current mirror section 13211 and a magnitude determining section 13213. The first current mirror section 13211 mirrors the first reference current IREF1 and generates first pre-program current $I_{PGM\_re1}$. The magnitude determining section 13213 is electrically coupled between the first current mirror section 13211 and a pulse time control unit 1323. Further, the magnitude determining section 13213 generates pre-emphasis current $I_{PRE}$ with a magnitude that is determined according to the first control codes CODE1<0:x>. Accordingly, the pre-emphasis current $I_{PRE}$ with the magnitude determined by the magnitude determining section 13213 is added to the first pre-program current $I_{PGM\_re1}$ generated by the first current mirror section 13211. In an embodiment, the magnitude determining section 13213 may be configured by a plurality of switching elements driven according to the respective control bits of the first control codes CODE1<0:x>. Further, the sizes of the respective switching elements may be designed to be the same with or different from one another.

The pulse time control unit 1323 may include a second current mirror section 13231 and a time determining section 13233. The second current mirror section 13231 mirrors the second reference current IREF2. In addition, the second current mirror section 13231 generates second pre-program current $I_{PGM\_re2}$ and supplies the second pre-program current $I_{PGM\_re2}$ to the output terminal of the pre-emphasis current $I_{PRE}$. The time determining section 13233 is electrically coupled between the output terminal of the pulse magnitude control unit 1321, in detail, the output terminal of the magnitude determining section 13213 and the memory circuit block 200. The time determining section 13233 determines the supply time of the pre-emphasis current $I_{PRE}$ generated by the pulse magnitude control unit 1321, in response to the second control codes CODE2<0:x>. Accordingly, the pre-emphasis current $I_{PRE}$ with the time determined by the time determining section 13233 is added to the second pre-program current $I_{PGM\_re2}$ generated by the second current mirror section 13231, and the output current of the time determining section 13233 is determined as the final program current $I_{PGM}$. In an embodiment, the time determining section 13233 may be configured by a plurality of switching elements driven according to the respective control bits of the second control codes CODE2<0:x>. Further, the sizes of the respective switching elements may be designed to be the same with or different from one another. In an embodiment, the first control codes CODE1<0:x> and the second control codes CODE2<0:x> may allow the program current $I_{PGM}$ to be applied to a target cell of the memory circuit block 200 for the preset program current application time. The first control codes CODE1<0:x> and the second control codes CODE2<0:x> may also determine the pre-emphasis current $I_{PRE}$ with the preset magnitude to be supplied for a preset time in an initial period of a program current application period.

Figure 5:
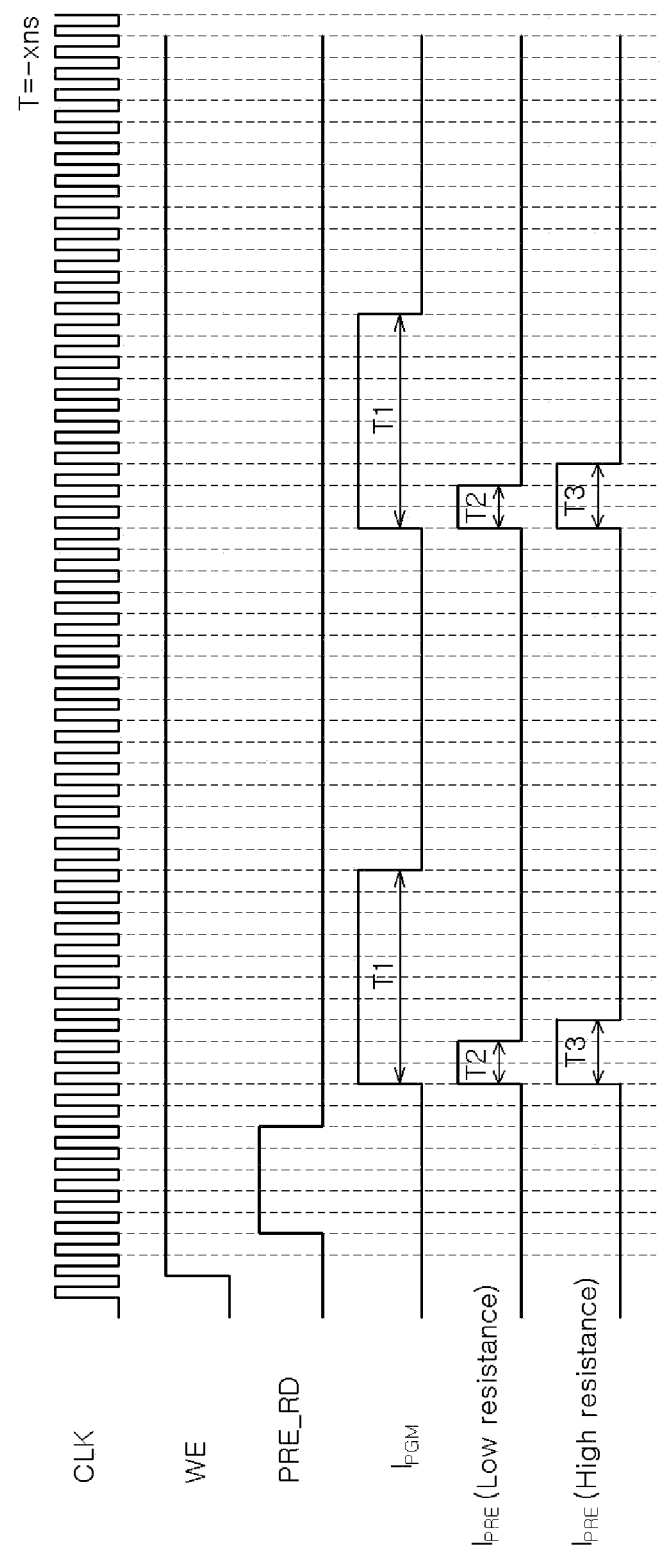
FIG. 5 is a representation of an example of a timing diagram to assist in the explanation of the operations of the variable resistance memory apparatus in accordance with an embodiment.

Referring to FIG. 5, a representation of an example of a timing diagram to assist in the explanation of the operations of the variable resistance memory apparatus in accordance with an embodiment is shown. Further, FIGS. 6 and 7 are representations of examples of flow charts to assist in the explanation of the operations of the variable resistance memory apparatus in accordance with an embodiment.

Figure 6:
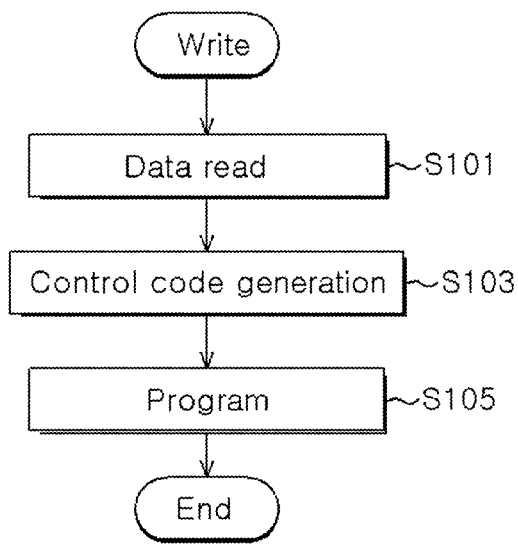
FIGS. 6 and 7 are representations of examples of flow charts to assist in the explanation of the operations of the variable resistance memory apparatus in accordance with an embodiment.
Figure 7:
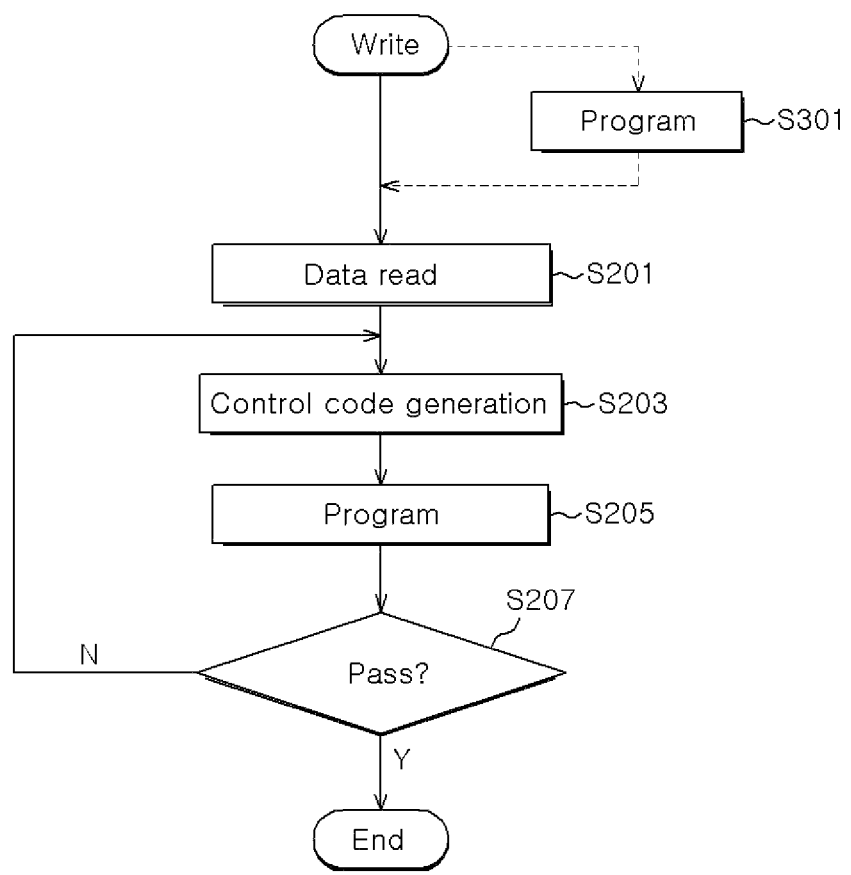

Referring to FIGS. 5 and 6, after a write enable signal WE is enabled in synchronization with a clock signal CLK, a pre-read operation is performed for a target memory cell to be programmed, in response to a pre-read signal PRE_RD (S101).

Control codes to determine the magnitude and the supply time of pre-emphasis current $I_{PRE}$ are generated according to the result of the pre-read operation (S103). FIG. 5 shows a time variable program scheme, that is, an example of supplying program current $I_{PGM}$ increased by the same multiple g, to respective target cells, as the pre-emphasis current $I_{PRE}$. The application time of the pre-emphasis current $I_{PRE}$ may be set long for a cell discriminated as a high resistant state as a result of the pre-read, among target cells intended to have the same resistance distribution. In addition, the application time of the pre-emphasis current $I_{PRE}$ may be set short for a cell which is discriminated as a low resistant state as a result of the pre-read, among the target cells intended to have the same resistance distribution.

As the pre-emphasis current $I_{PRE}$ determined in this way is supplied to a target cell by being added to the program current $I_{PGM}$ during an initial period T2 or T3 of a period T1 during which the program current $I_{PGM}$ is supplied, a program operation may be performed (S105).

Referring to FIG. 7, an operation in the case where the write operation according to an embodiment is applied to a program and verify scheme is shown.

Before a program operation is performed or after a program operation of a previous stage is performed (S301), the resistant states of target cells are pre-read (S201). According to a result of the pre-read, control codes to determine the magnitude and the supply time of pre-emphasis current $I_{PRE}$ are generated (S203). A detailed method to generate the control codes are the same as described above.

Thereafter, as the pre-emphasis current $I_{PRE}$ is supplied to a target cell by being added to program current $I_{PGM}$ during an initial period of a period during which the program current $I_{PGM}$ is supplied according to the generated control codes, a program operation may be performed (S205).

After the program is performed, a verification read operation is performed for the target cell to discriminate whether the target cell has a target resistant state or not (S207). According to a discrimination result, the program process is ended or returns to the step S203 to repeat subsequent steps.

Figure 8:
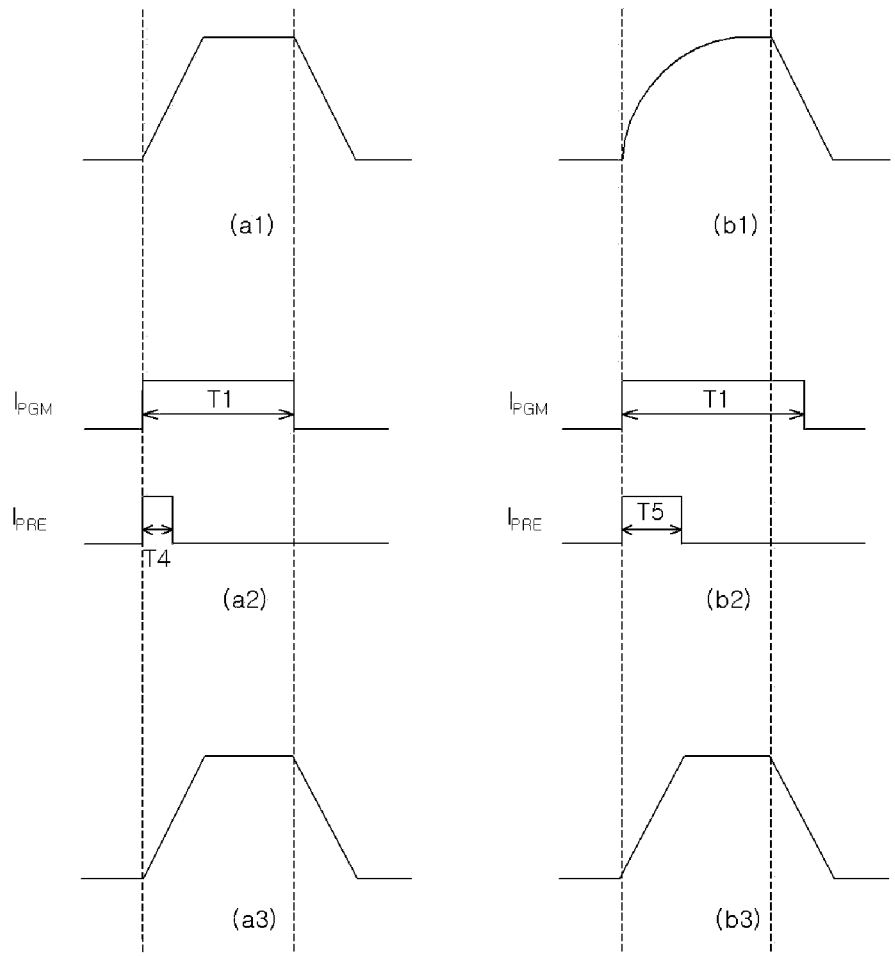
FIG. 8 is a representation of an example of a diagram to assist in the explanation of the shapes of program current pulses which are scaled by the time constants of target cells, in accordance with an embodiment.

Referring to FIG. 8, a representation of an example of a diagram to assist in the explanation of the shapes of program current pulses which are scaled by the time constants of target cells, in accordance with an embodiment is shown. In this regard, it was described above that a time constant is determined from parasitic components from a write driver to a target cell and a result of pre-reading the resistant state of the target cell.

In the case where a pre-emphasis technology is not applied, the shapes of program current pulses supplied to a cell with a relatively small time constant and a cell with a relatively large time constant are different from each other (a1 and b1).

In the case where the pre-emphasis technology as in an embodiment is applied, pre-emphasis current $I_{PRE}$ may be additionally supplied during an initial period corresponding to a first time T4 in a period T1 during which program current $I_{PGM}$ is supplied to the cell with the relatively small time constant (a2).

In addition, the pre-emphasis current $I_{PRE}$ may be additionally supplied during an initial period corresponding to a second time T5 longer than the first time T4 in the period T1 during which the program current $I_{PGM}$ is supplied to the cell with the relatively large time constant (b2).

As a result, program pulses with the same shape may be supplied to the cell with the relatively small time constant and the cell with the relatively large time constant (a3 and b3).

Referring to FIG. 8, an example that the pre-emphasis current $I_{PRE}$ is set to a fixed multiple of the program current $I_{PGM}$ and the supply time of the pre-emphasis current $I_{PRE}$ is changed according to parasitic components and a pre-read result is shown.

Figure 9:
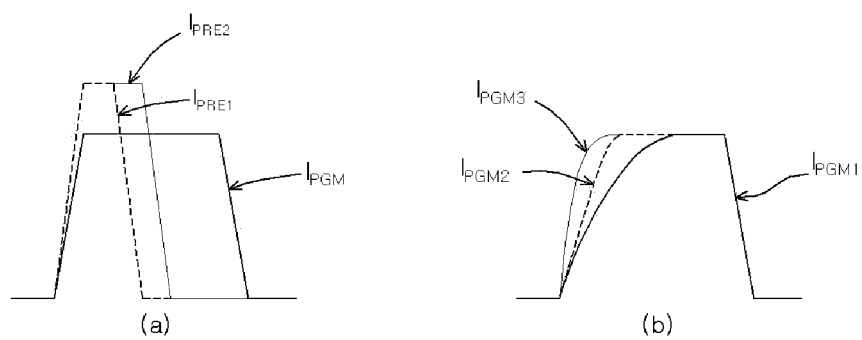
FIG. 9 is a representation of an example of a diagram to assist in the explanation of the shapes of program current pulses according to input program current and pre-emphasis current.

In the case of supplying the pre-emphasis current $I_{PRE}$ in this way, a result as shown in FIG. 9 may be confirmed. In the case where the pre-emphasis technology is not applied, first program current $I_{PGM1}$ with a slope lower than input program current $I_{PGM}$ is supplied to a target cell according to the time constant of the target cell, whereby it is difficult to obtain a desired program result.

In the case where the pre-emphasis technology is applied, first pre-emphasis current $I_{PRE1}$ may be supplied to a cell with a relatively small time constant, for a relatively short period, in addition to the program current $I_{PGM}$. Accordingly, a second program current $I_{PGM2}$ in which an initial period is compensated for by the first pre-emphasis current $I_{PRE1}$ may be supplied to the cell with the relatively small time constant. In addition, a second pre-emphasis current $I_{PRE2}$ may be supplied to a cell with a relatively large time constant, for a relatively long period, in addition to the program current $I_{PGM}$. As a result, a third program current $I_{PGM3}$ in which an initial period is compensated for by the second pre-emphasis current $I_{PRE2}$ may be supplied to the cell with the relatively long time constant.

Referring to FIGS. 10 to 14, representations of examples of diagrams to assist in the explanations of systems in accordance with embodiments are shown.

Figure 10:
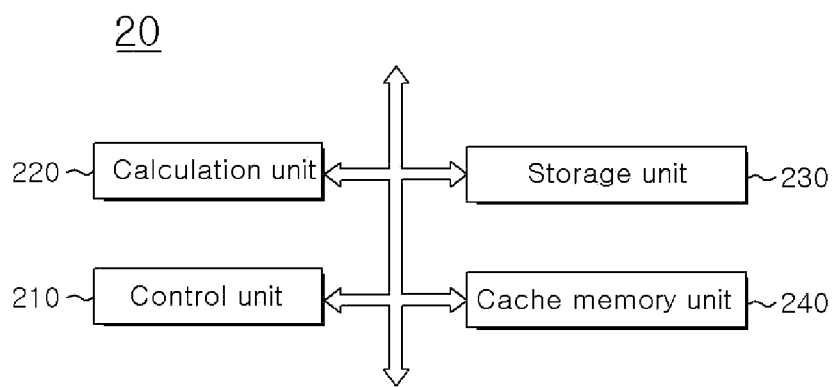
FIGS. 10 to 14 are representations of examples of diagrams to assist in the explanations of systems in accordance with embodiments.

FIG. 10 is a configuration diagram illustrating a representation of an example of a processor in accordance with an embodiment.

Referring to FIG. 10, a processor 20 may include a control unit 210, a calculation unit 220, a storage unit 230, and a cache memory unit 240.

The control unit 210 receives signals, such as commands and data, from an external device. The control unit 210 also decodes commands, performs input or output of data, and processes data, thereby controlling the general operations of the processor 20.

The calculation unit 220 performs various operations according to results of decoding commands by the control unit 210. The calculation unit 220 may include at least one arithmetic and logic unit (ALU).

The storage unit 230 may serve as a register and is a part which stores data in the processor 20. The storage unit 230 may include a data register, an address register, a floating point register, and various other registers. The storage unit 230 may store data to be calculated by the calculation unit 220, calculation result data, and addresses at which those data are stored.

The storage unit 230 may include, for example, a memory circuit block configured by variable resistance memory elements. The storage unit 230 may also include a controller including a control code generation unit, a read circuit block, and a write circuit block. In an embodiment, the storage unit 230 may be the variable resistance memory apparatus shown in FIG. 1. Accordingly, when performing write for a memory region according to the write command and the write data provided from the control unit 210, the resistant state of a target memory cell may be pre-read. In addition, it is possible to compensate for the initial period of program current by a pre-emphasis current pulse with a magnitude and a width determined based on a pre-read result and parasitic components.

The cache memory unit 240 serves as a temporary storage space.

The processor 20 illustrated in FIG. 10 may be a central processing unit (CPU), a graphic processing unit (GPU), a digital signal processor (DSP), an application processor (AP) or the like of an electronic apparatus.

Figure 11:
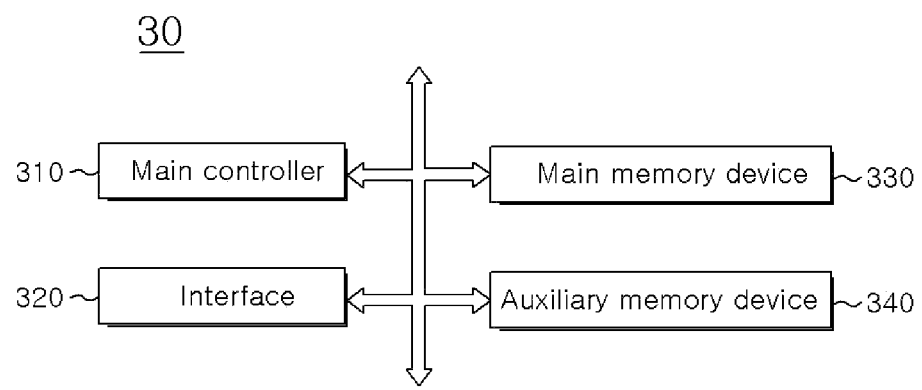
Figure 12:
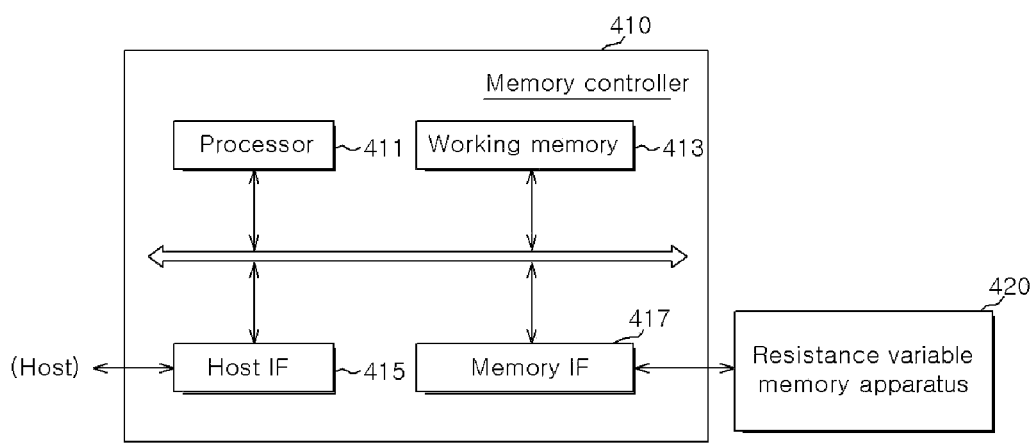

FIGS. 11 and 12 are configuration diagrams illustrating representations of examples of data processing systems in accordance with embodiments.

The data processing system 30 illustrated in FIG. 11 may include a main controller 310, an interface 320, a main memory device 330, and an auxiliary memory device 340.

The data processing system 30 may perform input, processing, output, communication, and storage to perform a series of operations to process data. The data processing system 30 may be an electronic apparatus such as a computer server, a personal digital assistant, a notebook computer, a web tablet computer, a wireless terminal, a mobile communication terminal, a digital contents player, a camera, a global positioning system, a video camera, a recorder, a telematics device, an AV system, a smart TV, and the like.

In an embodiment, the data processing system 30 may be a data storage device. Further, the data processing system 30 may be a disk type such as a hard disk, an optical drive, a solid state disk, a DVD, or the like, or a card type such as a universal serial bus (USB) memory, a secure digital (SD) card, a memory stick, a smart media card, an internal/external multimedia card, a compact flash card, or the like.

The main controller 310 controls data exchange through the main memory device 330 and the interface 320. To this end, the main controller 310 controls general operations of decoding the commands inputted through the interface 320 from an external device, and calculating and comparing the data stored in the system.

The interface 320 provides an environment in which commands and data may be exchanged between the external device and the data processing system 30. The interface 320 may be a man-machine interface device, a card interface device or a disk interface device, depending on the applied environment of the data processing system. The man-machine interface device may include an input device such as a keyboard, a keypad, a mouse and a voice recognition device and an output device such as a display and a speaker. The disk interface device may include IDE (Integrated Drive Electronics), SCSI (Small Computer System Interface), SATA (Serial Advanced Technology Attachment), eSATA (External SATA), PCMCIA (Personal Computer Memory Card International Association), or the like.

The main memory device 330 is configured to store applications, control signals, and data needed for the data processing system 30 to operate. The main memory device 330 serves as a storage to and from which program or data may be transferred from the auxiliary memory device 340 and may be executed. The main memory device 330 may be realized using a memory device having nonvolatile properties. For example, the variable resistance memory apparatus shown in FIG. 1 may be used as the main memory device 330.

The auxiliary memory device 340 is a space to store program codes or data, and may include a high-capacity memory device. For example, the variable resistance memory apparatus illustrated in FIG. 1 may be used as the auxiliary memory device 340.

More specifically, the main memory device 330 and/or the auxiliary memory device 340 may include, for example, a memory circuit block configured by variable resistance memory elements, a controller including a control code generation unit, a read circuit block, and a write circuit block. Accordingly, when performing write for a memory region according to the write command and the write data provided from the main controller 310, the resistant state of a target memory cell may be pre-read. In addition, it is possible to compensate for the initial period of program current by a pre-emphasis current pulse with a magnitude and a width determined based on a pre-read result and parasitic components.

The data processing system 40 illustrated in FIG. 12 may include a memory controller 410 and a variable resistance memory apparatus 420.

The memory controller 410 may be configured to access the variable resistance memory apparatus 420 in response to a request from a host. To this end, the memory controller 410 may include a processor 411, a working memory 413, a host interface 415, and a memory interface 417.

The processor 411 may control the general operations of the memory controller 410. In addition, the working memory 413 may store applications, data, control signals, and so forth, which are needed for the memory controller 410 to operate.

The host interface 415 may perform protocol conversion for exchange of data/control signals between the host and the memory controller 410. In addition, the memory interface 417 may perform protocol conversion for exchange of data/control signals between the memory controller 410 and the variable resistance memory apparatus 420.

The variable resistance memory apparatus 420 may use, for example, the variable resistance memory apparatus shown in FIG. 1. The variable resistance memory apparatus 420 may also include a memory circuit block configured by variable resistance memory elements, a controller including a control code generation unit, a read circuit block, and a write circuit block. Accordingly, when performing write for a memory region according to the write command and the write data provided from the memory controller 410, the resistant state of a target memory cell may be pre-read. Further, it is possible to compensate for the initial period of program current by a pre-emphasis current pulse with a magnitude and a width determined based on a pre-read result and parasitic components.

The data processing system 40 illustrated in FIG. 12 may be utilized as a disk device, an internal/external memory card of a portable electronic appliance, an image processor, or an application chip set.

Furthermore, the working memory 413 provided in the memory controller 410 may also be realized using the memory apparatus illustrated in FIG. 1.

Figure 13:
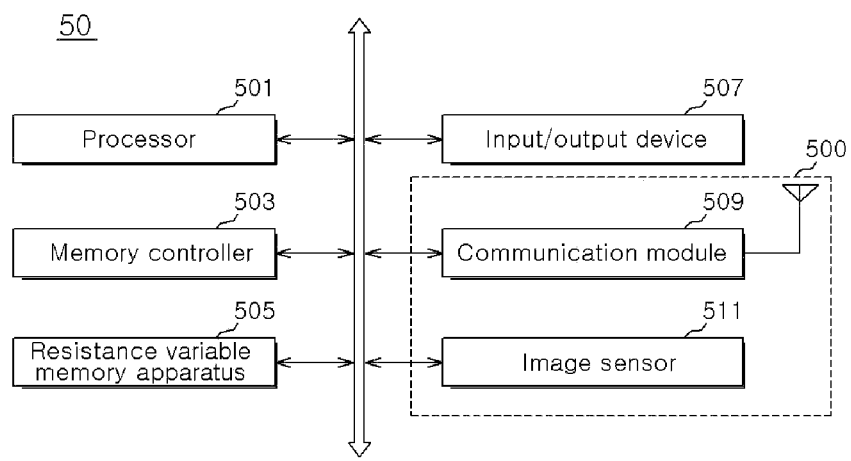
Figure 14:
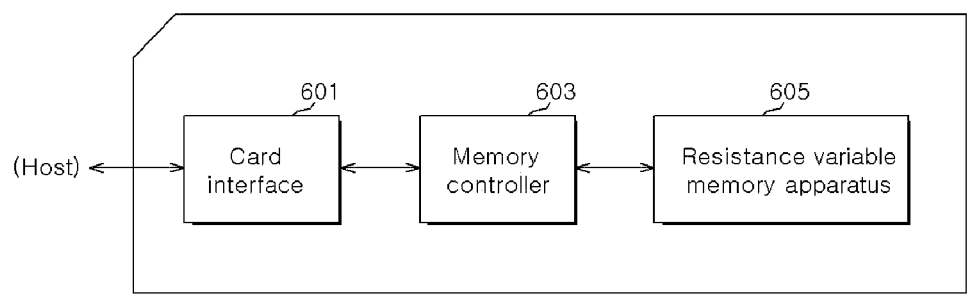

FIGS. 13 and 14 are configuration diagrams illustrating electronic systems in accordance with embodiments.

The electronic system 50 illustrated in FIG. 13 may include a processor 501, a memory controller 503, a variable resistance memory apparatus 505, an input/output device 507, and a function module 500.

The memory controller 503 may control a data processing operation of the variable resistance memory apparatus 505, for example, a write or read operation, under the control of the processor 501.

The data written in the variable resistance memory apparatus 505 may be outputted through the input/output device 507 under the control of the processor 501 and the memory controller 503. The input/output device 507 may include a display device, a speaker device, and so forth.

The input/output device 507 may also include an input device through which a control signal to control the operation of the processor 501 or data to be processed by the processor 501 may be inputted.

In an embodiment, the memory controller 503 may be realized as a part of the processor 501 or a chip set separate from the processor 501.

The variable resistance memory apparatus 505 may include, for example, a memory circuit block configured by variable resistance memory elements, a controller including a control code generation unit, a read circuit block, and a write circuit block. In an embodiment, the variable resistance memory apparatus 505 may be the variable resistance memory apparatus shown in FIG. 1. Thus, when performing write for a memory region according to the write command and the write data provided from the memory controller 503, the resistant state of a target memory cell may be pre-read. In addition, it is possible to compensate for the initial period of program current by a pre-emphasis current pulse with a magnitude and a width determined based on a pre-read result and parasitic components.

The function module 500 may be a module capable of performing a selected function according to an application example of the electronic system 50 illustrated in FIG. 13. FIG. 13 illustrates a communication module 509 and an image sensor 511 as an example of the function module 500.

The communication module 509 may provide a communication environment in which the electronic system 50 may access a wired or wireless communication network and exchange data and control signals.

The image sensor 511 converts an optical image into digital image signals and transmits the digital image signals to the processor 501 and the memory controller 503.

When the electronic system 50 of FIG. 13 is provided with the communication module 509, the electronic system 50 may operate as a portable communication appliance such as a wireless communication terminal. When the electronic system 50 is provided with the image sensor 511, the electronic system 50 may be an electronic system (for example, a PC, a notebook computer, a mobile communication terminal or the like) which is attached with a digital camera or a digital camcorder.

The electronic system 60 illustrated in FIG. 14 may include a card interface 601, a memory controller 603, and a variable resistance memory apparatus 605.

The electronic system 60 illustrated in FIG. 14 is an embodiment of a memory card or a smart card, and may be any one of a PC card, a multimedia card, an embedded multimedia card, a secure digital card, and a USB drive.

The card interface 601 interfaces exchange of data between a host and the memory controller 603, according to the protocol of the host. In an embodiment, the card interface 601 may mean a hardware capable of supporting the protocol used by the host, a software mounted on the hardware which supports the protocol used by the host, or a signal transmission scheme.

The memory controller 603 controls exchange of data between the variable resistance memory apparatus 605 and the card interface 601.

The variable resistance memory apparatus 605 may use the variable resistance memory apparatus shown in FIG. 1. More specifically, the variable resistance memory apparatus 605 may include a memory circuit block configured by variable resistance memory elements, a controller including a control code generation unit, a read circuit block, and a write circuit block. Accordingly, when performing write for a memory region according to the write command and the write data provided from the memory controller 603, the resistant state of a target memory cell may be pre-read. Further, it is possible to compensate for the initial period of program current by a pre-emphasis current pulse with a magnitude and a width determined based on a pre-read result and parasitic components.

While various embodiments have been described above, it will be understood to those skilled in the art that the embodiments described are by way of example only. Accordingly, the write driver, the variable resistance memory apparatus including the same, and the operation method described should not be limited based on the described embodiments.

What is claimed is:

1. A write driver comprising:
a pulse magnitude control unit configured to determine a magnitude of a pre-emphasis current pulse according to control codes generated according to parasitic components on a path from the write driver to a program target cell and a resistance value of the program target cell in a program mode, and
a pulse time control unit configured to determine application time of the pre-emphasis current pulse according to the control codes, and supply a program current to a memory circuit block by adding the pre-emphasis current pulse to a preset program current in the program mode;
wherein the pulse magnitude control unit comprises:
a first current mirror section configured to mirror a first reference current and generate a first pre-program current; and
a magnitude determining section electrically coupled between the first current mirror section and an output terminal, and configured to add the pre-emphasis current pulse with the magnitude determined according to the control codes to the first pre-program current, and supply an added current of the pre-emphasis current pulse and the pre-program current to the output terminal.

2. The write driver according to claim 1, wherein the magnitude determining section comprises:
a plurality of switching elements driven according to the control codes.

3. The write driver according to claim 1, wherein the pulse time control unit comprises:
a second current mirror section configured to mirror a second reference current, generate a second pre-program current, and supply the second pre-program current to the output terminal; and
a time determining section electrically coupled between the output terminal and the memory circuit block, and configured to determine the application time of the pre-emphasis current pulse according to the control codes.

4. The write driver according to claim 3, wherein the time determining section comprises:
a plurality of switching elements driven according to the control codes.

5. The write driver according to claim 1, wherein the magnitude of the pre-emphasis current pulse is set to be the same for all program target cells, and the application time of the pre-emphasis current pulse is determined according to the parasitic components and the resistance value of each of the program target cells.

6. The write driver according to claim 1, wherein the magnitude of the pre-emphasis current is set to be the same for program target cells which have a same distance from the write driver and is set to be different for program target cells which have different distances from the write driver, and the application time of the pre-emphasis current pulse is determined according to the magnitude of the pre-emphasis current pulse set for the program target cells, the parasitic components and the resistance value of each of the program target cells.

7. The write driver according to claim 1, wherein the application time of the pre-emphasis current pulse is set to be the same for all program target cells, and the magnitude of the pre-emphasis current pulse is determined according to the parasitic components and the resistance value of each of the program target cells.

8. A variable resistance memory apparatus comprising:
a memory circuit block including a plurality of variable resistance memory cells;
a controller configured to generate control codes according to parasitic components on a path from a write driver to a program target cell and a resistance value of the program target cell in a write mode;
wherein the write driver comprises a pulse magnitude control unit configured to determine a magnitude of a pre-emphasis current pulse according to the control codes; and
a pulse time control unit configured to determine application time of the pre-emphasis current pulse according to the control codes, and supply a program current to the memory circuit block by adding the pre-emphasis current pulse to a preset program current in a program mode;
wherein the pulse magnitude control unit comprises:
a first current mirror section configured to mirror a first reference current and generate a first pre-program current; and
a magnitude determining section electrically coupled between the first current mirror section and an output terminal, and configured to add the pre-emphasis current pulse with the magnitude determined according to the control codes to the first pre-program current, and supply an added current of the pre-emphasis current pulse and the pre-program current to the output terminal.

9. The variable resistance memory apparatus according to claim 8, wherein the controller generates the control codes such that the magnitude of the pre-emphasis current pulse is set to be the same for all program target cells, and the application time of the pre-emphasis current pulse is determined according to the parasitic components and the resistance value of each of the program target cells.

10. The variable resistance memory apparatus according to claim 8, wherein the controller generates the control codes such that the magnitude of the pre-emphasis current is set to be the same for program target cells which have a same distance from the write driver and is set to be different for program target cells which have different distances from the write driver, and the application time of the pre-emphasis current pulse is determined according to the magnitude of the pre-emphasis current pulse set for the program target cells, the parasitic components and the resistance value of each of the program target cells.

11. The variable resistance memory apparatus according to claim 8, wherein the controller generates the control codes such that the application time of the pre-emphasis current pulse is set to be the same for all program target cells, and the magnitude of the pre-emphasis current pulse is determined according to the parasitic components and the resistance value of each of the program target cells.

12. The variable resistance memory apparatus according to claim 8, wherein the magnitude determining section comprises:
 a plurality of switching elements driven according to the control codes.

13. The variable resistance memory apparatus according to claim 8, wherein the pulse time control unit comprises:
 a second current mirror section configured to mirror a second reference current, generate a second pre-program current, and supply the second pre-program current to the output terminal; and
 a time determining section electrically coupled between the output terminal and the memory circuit block, and configured to determine the application time of the pre-emphasis current pulse according to the control codes.

14. The variable resistance memory apparatus according to claim 13, wherein the time determining section comprises:
 a plurality of switching elements driven according to the control codes.

* * * * *